(12) United States Patent
Lee (10) Patent No.: US 8,233,348 B2
(45) Date of Patent: Jul. 31, 2012

(54) BANK ACTIVE SIGNAL GENERATION CIRCUIT

(75) Inventor: Kyong Ha Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 248 days.

(21) Appl. No.: 12/648,774

(22) Filed: Dec. 29, 2009

(65) Prior Publication Data

US 2011/0075502 A1    Mar. 31, 2011

(30) Foreign Application Priority Data

Sep. 30, 2009   (KR) .................. 10-2009-0092795

(51) Int. Cl.
*G11C 8/00* (2006.01)
(52) U.S. Cl. .................. 365/230.03; 365/230.08
(58) Field of Classification Search ............ 365/230.03, 365/230.08
See application file for complete search history.

(56) References Cited

U.S. PATENT DOCUMENTS

| | | | |
|---|---|---|---|
| 6,690,609 B2 * | 2/2004 | Keeth et al. ............ | 365/221 |
| 7,343,457 B1 | 3/2008 | End, III | |
| 7,492,661 B2 * | 2/2009 | Yoshida et al. ......... | 365/230.03 |
| 2001/0028589 A1 * | 10/2001 | Cho et al. .............. | 365/222 |
| 2009/0109783 A1 * | 4/2009 | Lee ...................... | 365/222 |

FOREIGN PATENT DOCUMENTS

| | | |
|---|---|---|
| KR | 1019980069842 A | 10/1998 |
| KR | 1020000011704 A | 2/2000 |

* cited by examiner

*Primary Examiner* — Huan Hoang
*Assistant Examiner* — Pablo Huerta
(74) *Attorney, Agent, or Firm* — Ladas & Parry LLP (57) ABSTRACT

The bank active signal generation circuit comprises a decoded signal generator and an active signal generator. The decoded signal generator generates decoded signals from a first bank access signal, a second bank access signal and a row address signal in response to when a prefetch signal at a first mode. The decoded signal generator also generates decoded signals from the first bank access signal, the second bank access signal, and a third bank access signal in response when the prefetch signal at a second mode. The active signal generator generates bank active signals in response to receiving the decoded signals, an active pulse and a precharge pulse.

22 Claims, 6 Drawing Sheets

BANK ACTIVE SIGNAL GENERATION CIRCUIT

CROSS-REFERENCE TO RELATED APPLICATIONS

The present application claims priority under 35 U.S.C 119(a) to Korean Application No. 10-2009-0092795, filed on Sep. 30, 2009, in the Korean Intellectual Property Office, which is incorporated by reference in its entirety as set forth in full.

BACKGROUND

Semiconductor memories, especially, dynamic random access memories (DRAMs) usually function in active and precharging operation modes. The active operation mode is conducted by selecting memory cells from decoding row addresses and enabling a column access by way of amplifying data of a selected memory cell array. The precharging operation mode is conducted to return the memory cell array into the previous state before the active operation begins.

With generalization of 4 or 8-bank architecture in DRAMs in recent years, during active operations, bank active signal generation circuits are used to select a bank, in which the active operation is enabled, from a plurality of banks by decoding a row address and generating a bank active signal. Subsequent to select a given bank, a word line driver decodes the row address so as to activate specific main and sub word lines in selecting a memory cell array. Among DRAMs, a combo-DRAM is operable in a 4-bit prefetch mode that coincidentally processes 4-bit data, as well as, operable in a 2-bit prefetch mode that coincidentally processes 2-bit data.

In the meantime, there has been a recently proposed technology of Low Power Double Data Rate 2 (LPDDR2) that promises to substantially improve power consumption and data transmission rates. The LPDDR2 technology makes it possible to achieve the data rates of up to 800 Mbps which are the highest in the industry given the power condition of 1.2V. With the LPDDR2 technology, it is available to package a mobile memory chip in the size of 9 mm×12 mm by using the 66 nm ultra-microscopic process. Nowadays, the LPDDR2 technology is regarded as effective in reducing power consumption and enhancing data rates which enhances profitability for mobile apparatuses.

SUMMARY

Accordingly, there is provided a bank active signal generation circuit capable of securing a uniform active period of bank active signals regardless of a prefetch mode.

In accordance with an aspect of the present invention, there is provided a bank active signal generation circuit may be comprised of: a decoded signal generator configured to generate decoded signals from a first bank access signal group and a row address signal in response to when a prefetch signal is at a first mode, the decoded signal generator also configured to generate the decoded signals from a second bank access signal group in response when the prefetch signal is at a second mode; and an active signal generator configured to generate a bank active signal in response to receiving the decoded signal, an active pulse and a precharge pulse.

In accordance with another aspect of the present invention, there is provided a bank active signal generation circuit may be comprised of: a decoded signal generator configured to generate decoded signals from a first bank access signal, a second bank access signal and a row address signal when a prefetch signal is at a first mode, the decoded signal generator also configured to generate the decoded signals from the first bank access signal, the second bank access signal, and a third bank access signal when the prefetch signal at a second mode; and a transmitter configured to transfer a first bank access signal or a row address in response to a prefetch signal, wherein the first bank active signal and the row address are input in sync with the same clock edge; and a decoder configured to generate a decoded signal, for generating a bank active signal, from an output signal of the transmitter and a second bank access signal.

A further understanding of the nature and advantages of the present invention herein may be realized by reference to the remaining portions of the specification and the attached drawings.

BRIEF DESCRIPTION OF THE DRAWINGS

The above and other aspects, features and other advantages will be more clearly understood from the following detailed description taken in conjunction with the accompanying drawings, in which.

DESCRIPTION OF EMBODIMENTS

Hereinafter, various embodiments will now be described more fully with reference to the accompanying drawings in which some embodiments are shown. However, specific structural and functional details disclosed herein are merely representative for purposes of describing embodiments of the present invention. Like numbers refer to like elements throughout the description of the drawings.

The terminology used herein is for the purpose of describing particular embodiments only and is not intended to be limiting of embodiments. As used herein, the singular forms "a," "an" and "the" are intended to comprise the plural forms as well, unless the context clearly indicates otherwise. It will be further understood that the terms "comprises," "comprising," "comprises" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" comprises any and all combinations of one or more of the associated listed items. Also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe embodiments, various aspects will be hereinafter described in detail with reference to the attached drawings.

Figure 1:
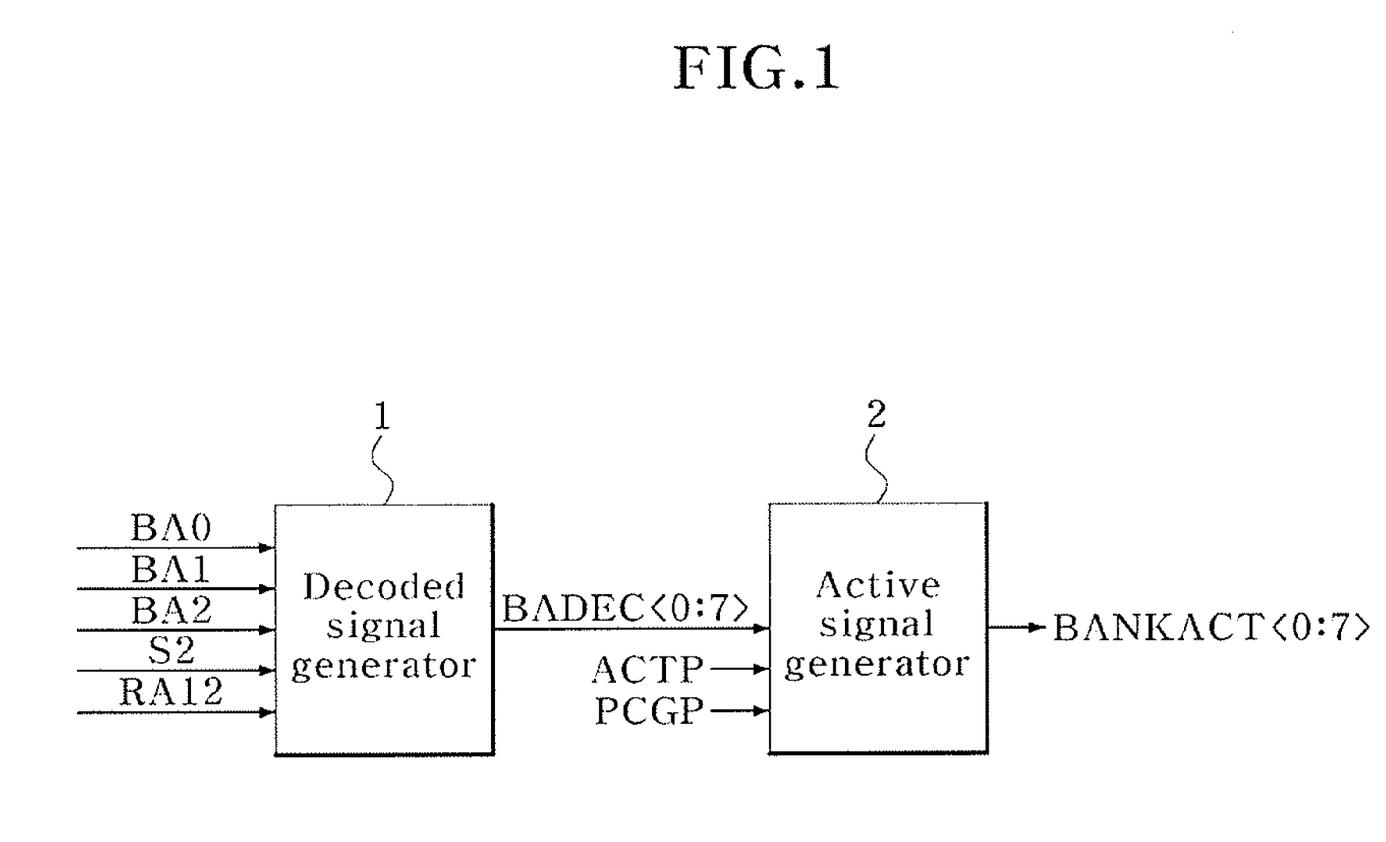
FIG. 1 is a block diagram illustrating a functional configuration of a bank active signal generation circuit according to an embodiment of the present invention.
Figure 2:
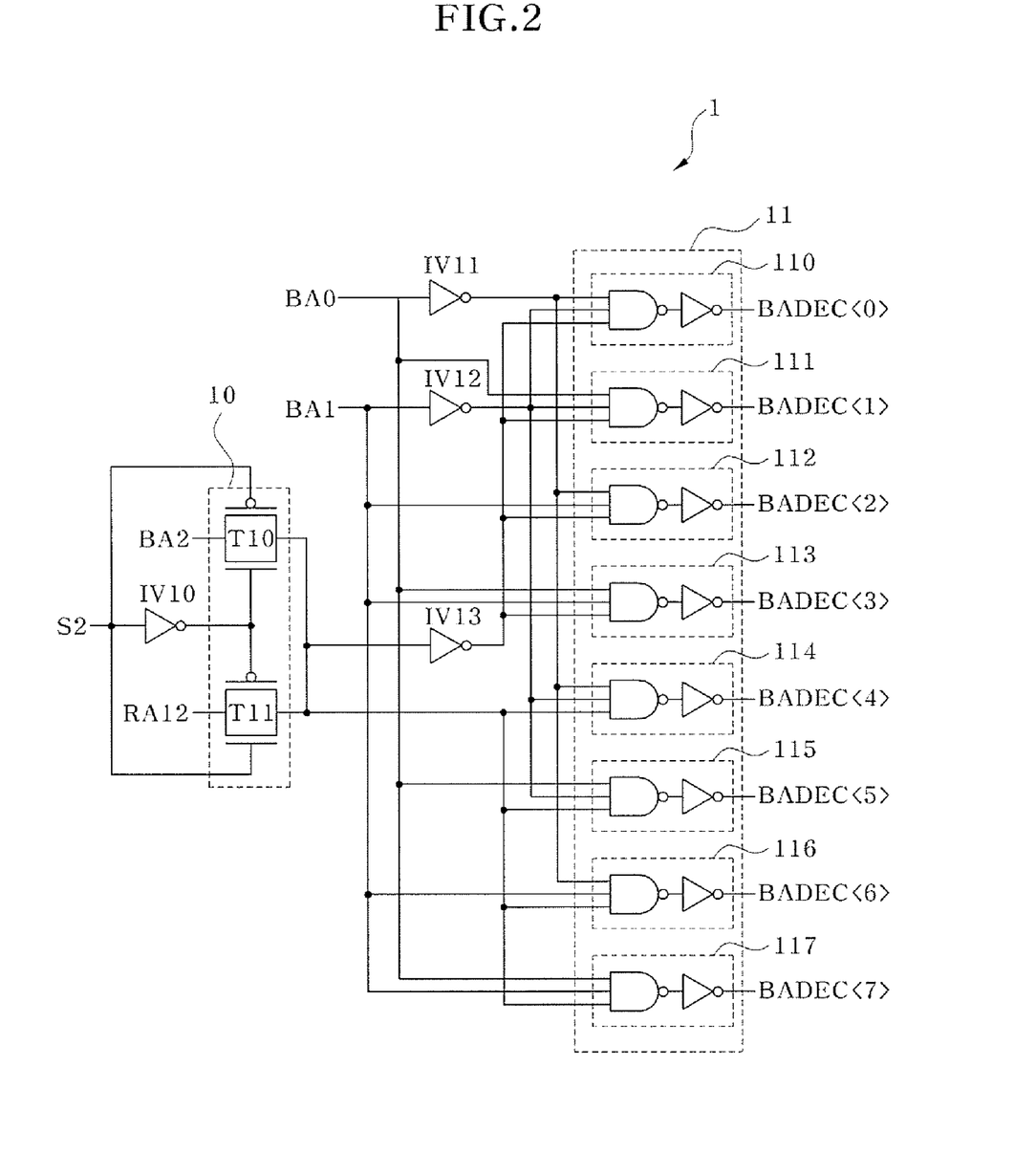
FIG. 2 is a circuit diagram illustrating the decoded signal generator of the bank active signal generation circuit shown in FIG. 1.
Figure 3:
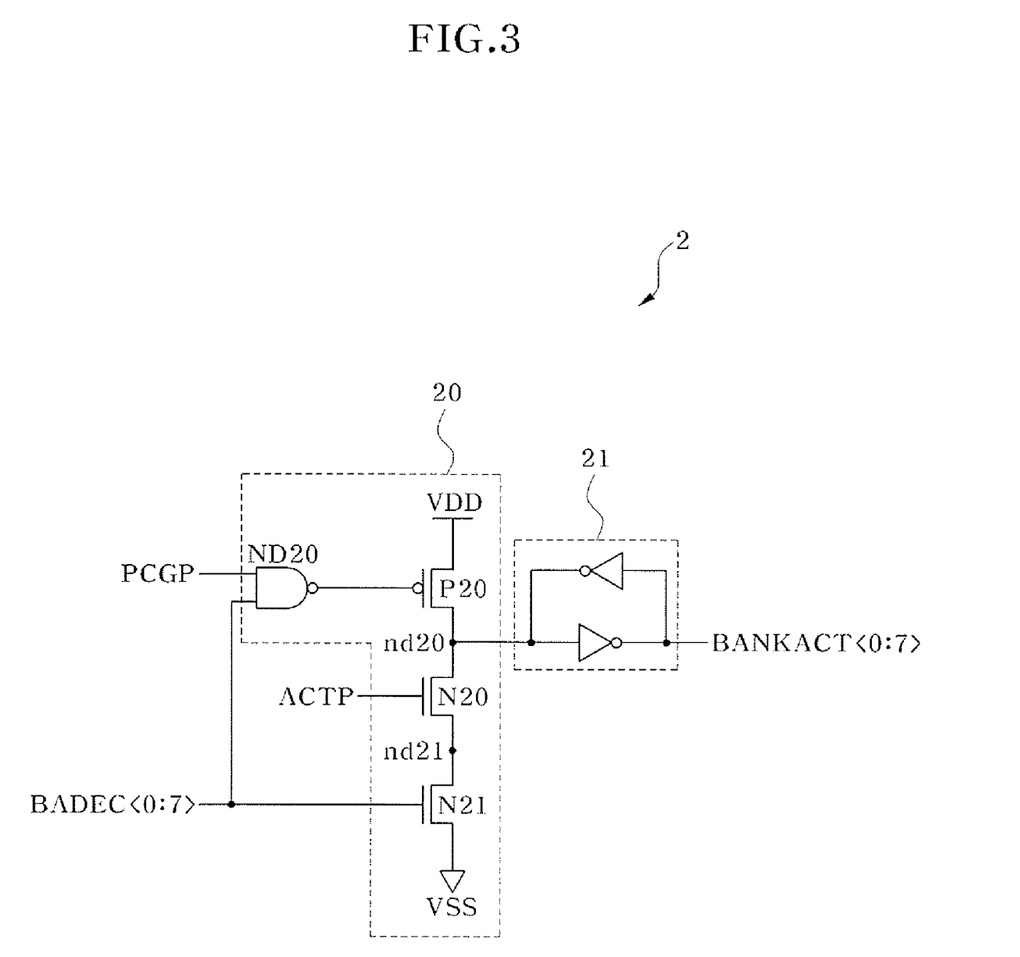
FIG. 3 is a circuit diagram illustrating the active signal generator of the bank active signal generation circuit shown in FIG. 1.

FIG. 1 exemplarily illustrates a functional block configuration of a bank active signal generation circuit according to an embodiment of the present invention. FIG. 2 exemplarily illustrates a circuit of a decoded signal generator comprised in the bank active signal generation circuit. FIG. 3 exemplarily illustrates a circuit of an active signal generator comprised in the bank active signal generation circuit.

As shown in FIG. 1, the bank active signal generation circuit may comprise the decoded signal generator 1 and the active signal generator 2.

Referring to FIG. 2, the decoded signal generator 1 may comprise a selective transmitter 10, a decoder 11 and a plurality of inverters IV10~IV13. The selective transmitter 10 may comprise transmission gates T10 and T11. The transmission gate T10 transfers a third bank access signal BA2 when a prefetch signal S2 is set at a low level state. The transmission gate T11 transfers a twelfth row address signal RA12 when the prefetch signal S2 is set at a high level state. The decoder 11 may comprise a plurality of AND gates 110~117 in which the decoder 11 is configured to generate first through eighth decoded signals BADEC<0:7> by decoding a first bank access signal BA0, a second bank access signal BA1 and an output signal of the selective transmitter 10. The prefetch signal S2 is set at a high level state when in a 2-bit prefetch mode. The prefetch signal S2 is set at a low level state when in a 4-bit prefetch mode. Thus, when in the 2-bit prefetch mode, the decoded signal generator 1 decodes the first bank access signal BA0, the second bank access signal BA1 and the twelfth row address signal RA12 to generate the first through eighth decoded signals BADEC<0:7>. When in the 4-bit prefetch mode, the decoded signal generator 1 decodes the first bank access signal BA0, the second bank access signal BA1 and the third bank access signal BA2 to generate the first through eighth decoded signals BADEC<0:7>.

Now referring to FIG. 3, the active signal generator 2 may comprise of a driver 20 and a latch 21. The driver 20 is exemplarily formed of a NAND gate ND20, a P-type metal-oxide-semiconductor (PMOS) transistor P20, an N-type metal-oxide-semiconductor (NMOS) transistor N20 and an NMOS transistor N21. The NAND gate ND20 executes a not-AND operation using the first through eighth decoded signals BADEC<0:7> and a precharge pulse PCGP. The PMOS transistor P20 is coupled between a terminal of the power voltage VDD and a node nd20 and functions as a pull-up element to pull up a voltage level of the node nd20 in response to an output signal of the NAND gate ND20. The NMOS transistor N20 is coupled between the node nd20 and a node nd21 and functions as a pull-down element turned on in response to an active pulse ACTP. The NMOS transistor N21 is coupled between the node nd21 and a terminal of the ground voltage VSS and functions as a pull-down element turned on in response to the first through eighth decoded signals BADEC<0:7>. The latch 21 generates first through eighth bank active signals BANKACT<0:7> by latching a signal of the node nd20. The precharge pulse PCGP comprises a signal including a pulse that is generated after a predetermined period subsequent to an input of a precharge command. The active pulse ACTP comprises a signal having a pulse that is generated after a predetermined period subsequent to an input of an active command. Although the active signal generator 2 is shown by a single circuit in FIG. 3, it may be implemented in a plurality of independent circuits outputting the first through eighth bank active signals BANKACT<0:7> respectively in response to receiving the first through eighth decoded signals BADEC<0:7>.

With this configuration, the active signal generator 2 activates the first through eighth bank active signals BANKACT<0:7> in high level states when the active pulse ACTP is activated when at a high level state while the first through eighth decoded signals BADEC<0:7> are activated into high level states. On the other hand, the active signal generator 2 inactivates the first through eighth bank active signals BANKACT<0:7> into low level states when the precharge pulse PCGP is activated at a high level state while the first through eighth decoded signals BADEC<0:7> are being inactive at low level states.

Figure 4:
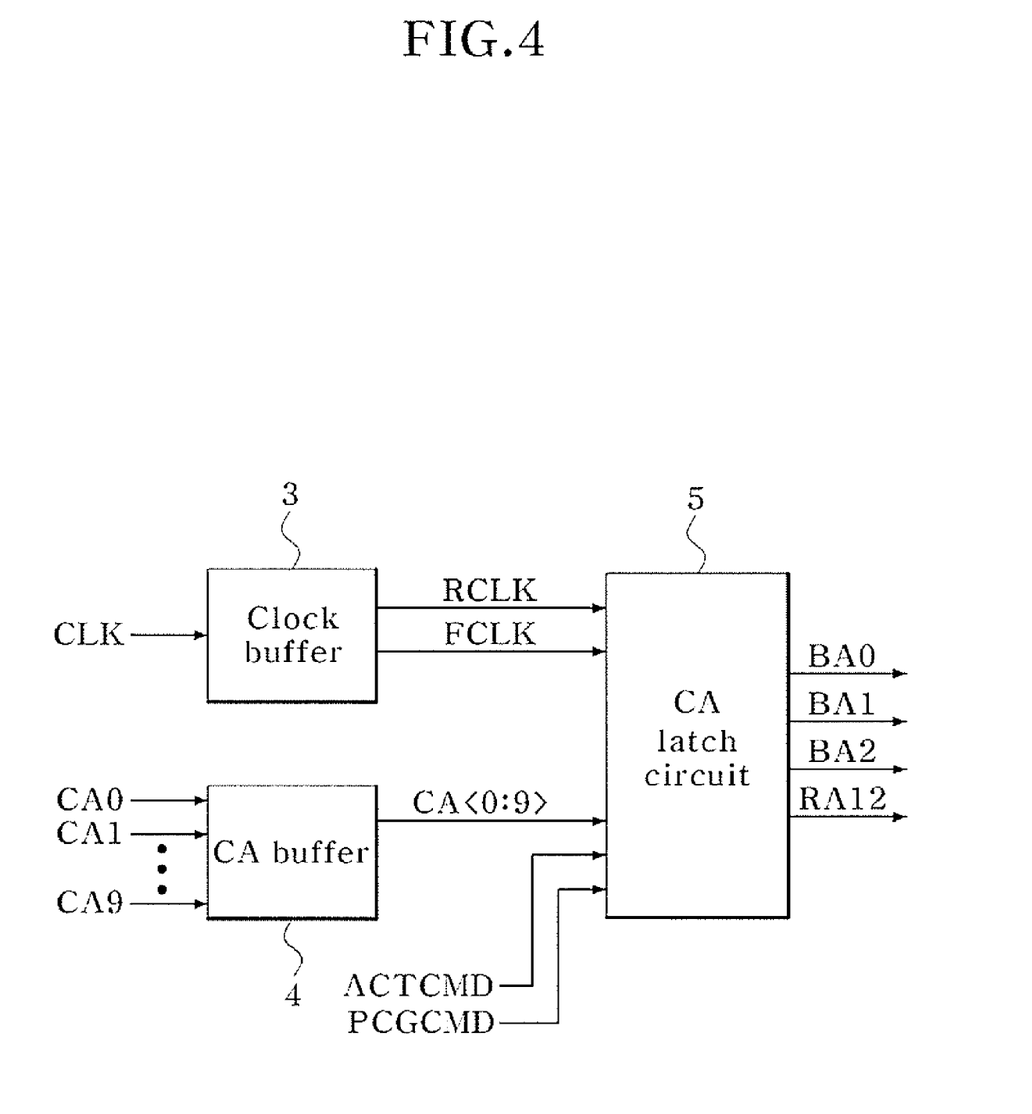
FIG. 4 is a block diagram illustrating a functional configuration of a signal input circuit for generating first through third bank access signals and a twelfth row address signal which are input into the decoded signal generator shown in FIG. 1.

Meanwhile, it can be seen from FIG. 4 that a signal input circuit can be configured to generate the first through third bank access signals, BA0, BA1 and BA2, and the twelfth row address signal RA12, all of which are applied into the decoded signal generator 1 as shown in FIG. 1. The signal input circuit of FIG. 4 may comprise a clock buffer 3, a command address buffer 4 and a command address latch circuit 5. The clock buffer 3 generates a rising clock RCLK and a falling clock FCLK by buffering a clock CLK. The command address (CA) buffer 4 generates first through tenth command address signals CA<0:9> by respectively buffering signals of first through tenth command address pins CA0~CA9. The command address latch circuit 5 generates the first bank access signals BA0~BA2 and the twelfth row address signals RA12 by latching the first through tenth command address signals CA<0:9> in sync with the rising clock RCLK in the condition that the active command ACTCMD or the precharge command PCGCMD has been input into the DRAM including the bank active signal generation circuit.

Table 1 shows an example arrangement with signal types that are input through the first through tenth command address pins CA0~CA9 in the condition that the active command ACTCMD or the precharge command PCGCMD has been input under that of Low Power Double Data Rate 2 (LPDDR2) specification conditions.

TABLE 1

| CLK | PIN | | | | | | | | | |
|---|---|---|---|---|---|---|---|---|---|---|
| | CA0 | CA1 | CA2 | CA3 | CA4 | CA5 | CA6 | CA7 | CA8 | CA9 |
| RISING EDGE | L | H | RA8 | RA9 | RA10 | RA11 | RA12 | BA0 | BA1 | BA2 |
| FALLING EDGE | RA0 | RA1 | RA2 | RA3 | RA4 | RA5 | RA6 | RA7 | RA13 | RA14 |

From Table 1, in the condition that the active command ACTCMD has been input, the command address latch circuit 5 generates the first bank access signal BA0, the second bank access signal BA1, the third bank access signal BA2 and the twelfth row address signal RA12 by latching the seventh through tenth command address signals CA<6:9>, which are generated by buffering signals of the seventh through tenth command address pins CA6~CA9, in sync with the rising clock RCLK. As the twelfth row address signal RA12 and the third bank access signal BA2 are all input in sync with a rising edge of the clock CLK, then the first through eighth decoded signals BADEC<0:7> used in the 2-bit and 4-bit prefetch modes are activated at the same time.

Figure 5:
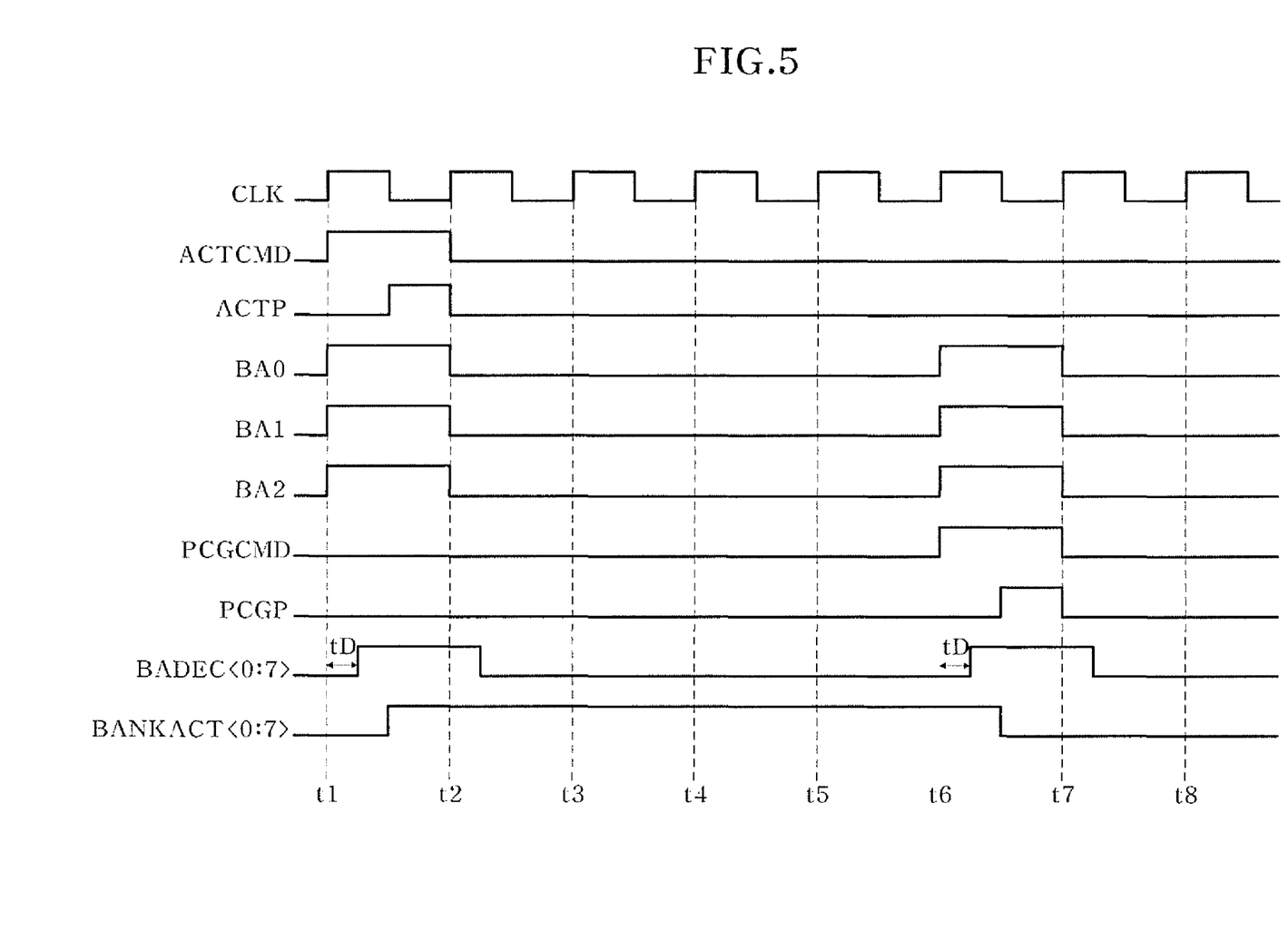
FIG. 5 is a timing diagram illustrating an operation of a 4-bit prefetch mode by the bank active signal generation circuit shown in FIG. 1.

Now hereinafter will be described an operation of the bank active signal generation circuit with the aforementioned configuration, dividing the operational patterns into the 2-bit and 4-bit prefetch modes, with reference to the timing flows of FIGS. 5 and 6.

First, the operation of the bank active signal generation circuit in the 4-bit prefetch mode will be described in conjunction with FIG. 5.

At time t1, when the active command ACTCMD is applied, the first bank access signal BA0, the second bank access signal BA1 and the third bank access signal BA2 are input in sync with a rising edge of the clock CLK. The active pulse ACTP is generated in sync with a falling edge of the clock CLK. In the 4-bit prefetch mode, as the prefetch signal S2 is set at a low level state, the decoded signal generator 1 decodes the first bank access signal BA0, the second bank access signal BA1 and the third bank access signal BA2 so as to generate the first through eighth decoded signals BADEC<0:7>.

Next, the active signal generator 2 outputs the first through eighth bank active signals BANKACT<0:7> that are activated into high level states at the time when the active pulse ACTP is activated as a high level state while the first through eighth decoded signals BADEC<0:7> are activated as high level states. Here, the first through eighth decoded signals BADEC<0:7> are all generated into high level states while the first bank access signal BA0, the second bank access signal BA1 and the third bank access signal BA2 remain at high level states.

Afterward, when the precharge command PCGCMD is applied thereto at a time t6, the first bank access signal BA0, the second bank access signal BA1 and the third bank access signal BA2 are input in sync with a rising edge of the clock CLK and the precharge pulse PCGP is generated in sync with a falling edge of the clock CLK. In the 4-bit prefetch mode, as the prefetch signal S2 is set to a low level state, the decoded signal generator 1 decodes the first bank access signal BA0, the second bank access signal BA1 and the third bank access signal BA2 so as to generate the first through eighth decoded signals BADEC<0:7>.

Next, the active signal generator 2 outputs the first through eighth bank active signals BANKACT<0:7> that are activated as high level states at the time when the precharge pulse PCGP is activated as a high level state while the first through eighth decoded signals BADEC<0:7> are activated as high level states.

Now, the operation of the bank active signal generation circuit in the 2-bit prefetch mode will be described in conjunction with FIG. 6.

Figure 6:
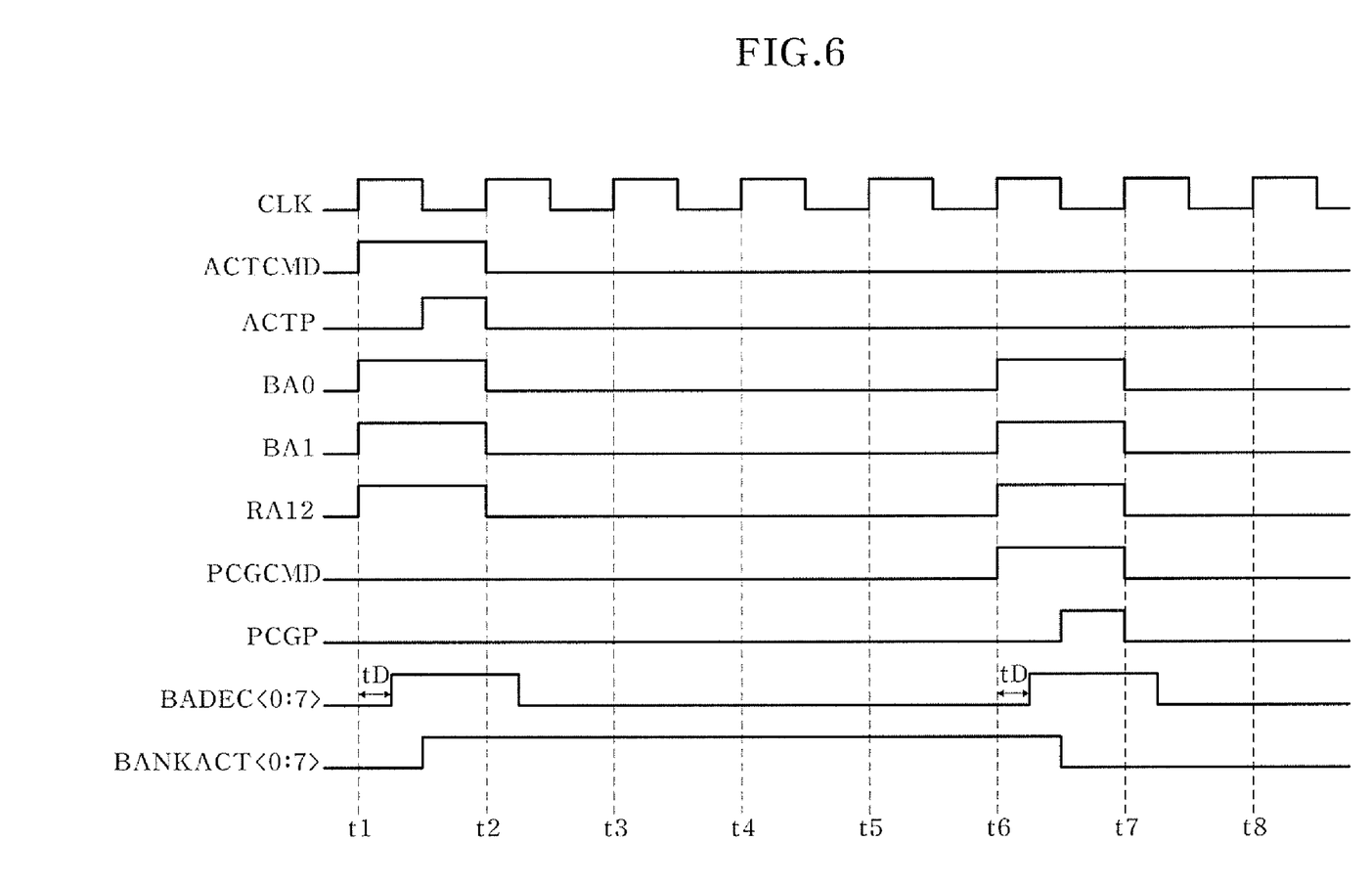
FIG. 6 is a timing diagram illustrating an operation of a 2-bit prefetch mode by the bank active signal generation circuit shown in FIG. 1.

At a time t1 of FIG. 6, when the active command ACTCMD is applied, the first bank access signal BA0, the second bank access signal BA1 and the third bank access signal BA2 are input in sync with a rising edge of the clock CLK. The active pulse ACTP is generated in sync with a falling edge of the clock CLK. In the 2-bit prefetch mode, as the prefetch signal S2 is set as a high level state, the decoded signal generator 1 decodes the first bank access signal BA0, the second bank access signal BA1 and the third bank access signal BA2 so as to generate the first through eighth decoded signals BADEC<0:7>.

Next, the active signal generator 2 outputs the first through eighth bank active signals BANKACT<0:7> that are activated as high level states at the time when the active pulse ACTP is activated as a high level state while the first through eighth decoded signals BADEC<0:7> are active as high level states. Here, the first through eighth decoded signals BADEC<0:7> are all generated as high level states while the first bank access signal BA0, the second bank access signal BA1 and the third bank access signal BA2 are all kept at high level states.

Afterward, when the precharge command PCGCMD is applied thereto at time t6 of FIG. 6, the first bank access signal BA0, the second bank access signal BA1 and the twelfth row address signal RA12 are input in sync with a rising edge of the clock CLK and the precharge pulse PCGP is generated in sync with a falling edge of the clock CLK. In the 2-bit prefetch mode, as the prefetch signal S2 is set into a high level state, the decoded signal generator 1 decodes the first bank access signal BA0, the second bank access signal BA1 and the twelfth row address signal RA12 so as to generate the first through eighth decoded signals BADEC<0:7>.

Next, the active signal generator 2 outputs the first through eighth bank active signals BANKACT<0:7> that are activated as high level states at the time when the precharge pulse PCGP is activated as a high level state while the first through eighth decoded signals BADEC<0:7> are active as high level states.

As described above, the bank active signal generation circuit according to this embodiment operates to make the plurality of bank active signals uniform, regardless of a type of prefetch mode, in a combo-DRAM that is operable in either the 2-bit prefetch mode or the 4-bit prefetch mode.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be comprised within the scope of this invention as defined in the claims.

What is claimed is:

1. A bank active signal generation circuit comprising:
   a decoded signal generator configured to generate decoded signals from a first bank access signal group and a row address signal in response to when a prefetch signal is at a first mode, the decoded signal generator also configured to generate the decoded signals from a second bank access signal group in response when the prefetch signal is at a second mode; and
   an active signal generator configured to generate bank active signals in response to receiving the decoded signals, an active pulse and a precharge pulse,
   wherein the number of data coincidentally processed when the prefetch signal is at the second mode is more than that of data coincidentally processed when the prefetch signal is at the first mode.

2. The bank active signal generation circuit according to claim 1, wherein the first bank access signal group comprises a first bank access signal and a second bank signal, and the second bank access signal group comprises the first bank access signal, the second bank signal and a third bank access signal.

3. The bank active signal generation circuit according to claim 2, wherein the first bank access signal, the second bank signal and the row address signal are all input in sync with each other at a single clock edge when the prefetch signal is at the first mode.

4. The bank active signal generation circuit according to claim 1, wherein the first mode of the prefetch signal corresponds to a 2-bit prefetch mode, wherein the second mode of the prefetch signal corresponds to a 4-bit prefetch mode.

5. The bank active signal generation circuit according to claim 2, wherein the first bank access signal, the second bank signal, and the third bank signal are all input in sync with each other at a single clock edge when the prefetch signal is at the second mode.

6. The bank active signal generation circuit according to claim 4, wherein the decoded signal generator comprises:
 a selective transmitter configured to selectively transfer an output corresponding to the row address signal when the prefetch signal is at the first mode and configured to selectively transfer the output corresponding to the third bank access signal when the prefetch signal is at the second mode; and
 a decoder configured to generate the decoded signals from the first bank access signal, the second bank access signal and the output of the selective transmitter.

7. The bank active signal generation circuit according to claim 6, wherein the selective transmitter comprises:
 a first transmission gate configured to transfer the third bank access signal as the output of the selective transmitter when the prefetch signal is at the second mode; and
 a second transmission gate configured to transfer the row address as the output of the selective transmitter when the prefetch signal is at the first mode.

8. The bank active signal generation circuit according to claim 1, wherein the active signal generator comprises:
 a driver configured to pull down a voltage level of a first node when the active pulse is activated while the decoded signal is active and configured to pull up the voltage level of the first node when the precharge pulse is activated while the decoded signal is active; and
 a latch configured to generate the bank active signals by latching a signal of the first node.

9. The bank active signal generation circuit according to claim 8, wherein the driver comprises:
 a logical element configured to use the decoded signals and the precharge pulse in a logical operation to output a logical signal;
 a pull-up element coupled between a power voltage terminal and the first node and configured to pull up the voltage level of the first node in response to the logical signal;
 a first pull-down element coupled between the first node and a second node and turned on in response to the active pulse; and
 a second pull-down element coupled between the second node and a ground voltage terminal and turned on in response to the decoded signals.

10. The bank active signal generation circuit according to claim 9, wherein the first and second pull-down elements are all turned on to pull down the voltage level of the first node when the active pulse is activated while the decoded signal is active.

11. The bank active signal generation circuit according to claim 1, further comprising:
 a clock buffer configured to generate an internal clock by buffering a clock;
 a command address buffer configured to generate command address signals by buffering signals of command address pins; and
 a command address latch circuit configured to generate the first, second, and third bank address signals and the row address signal by latching the command address signals in response to the internal clock.

12. The bank active signal generation circuit according to claim 11, wherein the internal clock is generated in sync with a rising edge of the clock.

13. The bank active signal generation circuit according to claim 1, wherein 2-bit data is processed coincidentally in the first mode, and 4-bit data is processed coincidentally in the second mode.

14. The bank active signal generation circuit according to claim 1, wherein the first mode corresponds to a high state and the second mode corresponds to a low state.

15. The bank active signal generation circuit according to claim 1, wherein the first mode corresponds to a low state and the second mode corresponds to a high state.

16. A bank active signal generation circuit comprising:
 a decoded signal generator configured to generate decoded signals from a first bank access signal, a second bank access signal and a row address signal when a prefetch signal is at a first mode, the decoded signal generator also configured to generate the decoded signals from the first bank access signal, the second bank access signal, and a third bank access signal when the prefetch signal at a second mode; and
 a transmitter configured to transfer the third bank access signal or the row address signal in response to the prefetch signal, wherein the third bank active signal and the row address are input in sync with the same clock edge,
 wherein the number of data coincidentally processed when the prefetch signal is at the second mode is more than that of data coincidentally processed when the prefetch signal is at the first mode.

17. The bank active signal generation circuit according to claim 16, wherein the selective transmitter comprises:
 a first transmission gate configured to transfer the third bank access signal in response to when the prefetch signal is at the second mode; and
 a second transmission gate configured to transfer the row address in response to when the prefetch signal is at the first mode.

18. The bank active signal generation circuit according to claim 16, further comprising:
 a clock buffer configured to generate an internal clock by buffering a clock;
 a command address buffer configured to generate first through third command address signals by buffering signals of first through third command address pins; and
 a command address latch circuit configured to generate the first bank address signal, the second bank address signal, the third bank address signal and the row address signal by latching the first through third command address signals in response to the internal clock.

19. The bank active signal generation circuit according to claim 18, wherein the internal clock is generated in sync with a rising edge of the clock.

20. The bank active signal generation circuit according to claim 16, wherein 2-bit data is processed coincidentally in the first mode, and 4-bit data is processed coincidentally in the second mode.

21. The bank active signal generation circuit according to claim 16, wherein the first mode corresponds to a high state and the second mode corresponds to a low state.

22. The bank active signal generation circuit according to claim 16, wherein the first mode corresponds to a low state and the second mode corresponds to a high state.

* * * * *